United States Patent [19]

Rogers et al.

[11] 4,288,738
[45] Sep. 8, 1981

[54] DUAL-MODE AMPLIFIER

[75] Inventors: Jerrold J. Rogers; John Durecka, both of Beaverton, Oreg.

[73] Assignee: Tektronix, Inc., Beaverton, Oreg.

[21] Appl. No.: 137,039

[22] Filed: Apr. 3, 1980

[51] Int. Cl.³ .............................................. H03K 17/64
[52] U.S. Cl. ..................................... 323/271; 315/411; 323/288
[58] Field of Search ............... 323/17, 23, 25, DIG. 1; 315/411

[56] References Cited

U.S. PATENT DOCUMENTS

| | | | |
|---|---|---|---|
| 3,294,981 | 12/1966 | Bose | 323/DIG. 1 |
| 3,906,333 | 9/1975 | Kalmanash | 323/17 |
| 3,909,701 | 9/1975 | Waehner | 323/23 X |
| 3,935,529 | 1/1976 | Kalmanash et al. | 323/DIG. 1 |

Primary Examiner—A. D. Pellinen

Attorney, Agent, or Firm—Thomas J. Spence

[57] ABSTRACT

A circuit, including a dual-mode amplifier, for producing a controlled current through an inductance; in particular, the inductive yoke of a cathode-ray tube electromagnetic deflection system. A diode coupled to a fly-back capacitor operates automatically to connect the capacitor in parallel resonant connection with the yoke whenever the voltage induced in the yoke exceeds a predetermined value, thereby switching the circuit from a linear mode to a non-linear mode. In a repetitive beam-sweeping environment, the circuit operates in the linear mode during forward scan time and in the non-linear mode during reverse retrace time. In the more general case, the circuit switches from linear operation to non-linear operation whenever the rate of change of a single input signal exceeds a predetermined design rate.

8 Claims, 3 Drawing Figures

DUAL-MODE AMPLIFIER

BACKGROUND OF THE INVENTION

The subject matter of the present invention pertains to means for producing a controlled current through an inductance; in particular, the inductive yoke of a cathode-ray tube electromagnetic deflection system.

As is known to the art, the presentation of a raster-scan image on the display screen of a cathode-ray tube requires that an electron beam be deflected across the screen in two mutually orthogonal directions; a first direction at a rate of once per image field, and a second direction at a rate of once per raster line. At the completion of each field or line, the beam, usually blanked to prevent visual interference with the displayed image, is deflected back, or retraced, across the display screen to a starting point for the next field or line. Many circuits have been devised for deflecting the beam back to a new starting point in the least amount of time consistent with normal limits of power availability and component power rating. Examples of such circuits are well known to the art and, for horizontal retrace scanning, include those described in Morrey U.S. Pat. No. 3,739,224, Wilcox U.S. Pat. No. 3,727,096, Rodal U.S. Pat. No. 3,529,206, Wheatley U.S. Pat. No. 3,449,622, Ushikubo et al U.S. Pat. No. 3,444,424, Hansen et al U.S. Pat. No. 3,430,096, and Jones U.S. Pat. No. 3,428,856.

Recently, it has become evident that rapid retrace can be achieved most efficiently by use of a dual-mode amplifier capable of being switched between a linear mode for forward scanning operation, and a non-linear resonant mode for retrace operation. Examples of such circuits include those disclosed in Hilburn U.S. Pat. No. 3,786,303 and Spencer U.S. Pat. No. 3,816,792. In the Hilburn circuit, a fly-back capacitor is connected in parallel with the horizontal deflection coil and a transistor connecting the capacitor and the coil to a source of negative potential is switched, under control of a synchronization signal separate from the input deflection signal, to perform the desired intermodal alternation. The Spencer circuit is similar except that the fly-back capacitor is switched, also under control of a separate synchronization signal, to be in the circuit only during retrace operation.

A primary disadvantage of both the Hilburn circuit and the Spencer circuit is that they require the provision of a synchronization signal in addition to the conventional input deflection signal, and they require the inclusion of specialized switching circuitry to perform the intermodal alternation. An additional disadvantage is that neither circuit is capable of processing an input deflection signal of other than the conventional positive-going forward scan/negative-going reverse retrace form.

SUMMARY OF THE INVENTION

The present invention is directed to a circuit for controlling current flow through the inductive yoke of a cathode-ray tube electromagnetic deflection system. More particularly, the circuit of the present invention comprises a symmetrical deflection amplifier capable of switching automatically between a linear mode and a non-linear mode solely in response to the rate of change of an input waveform. In the repetitive-sweep environment of a conventional cathode-ray tube deflection scheme, the circuit operates in the linear mode during forward beam scanning, and in the non-linear mode during reverse beam retrace. In the more general case, the circuit operates in the linear mode as long as the rate of change of the input wave form is less than a predetermined design value, and in the non-linear mode whenever the input waveform changes at a rate greater than such value. Switching between the two modes is accomplished solely in response to changes in the input waveform and requires no separate stimulus such as, for example, from an associated synchronization signal.

Operation of the circuit in a repetitive-sweep environment is characterized by the automatic switching of a fly-back capacitor into parallel resonant connection with the inductive yoke of the electromagnetic deflection system only during beam-retrace time, or whenever the input signal changes at a rate sufficiently high to cause a voltage to be induced in the yoke at a level sufficient to forward bias a normally reverse-biased diode coupling the capacitor to the remainder of the circuit. A second fly-back capacitor and associated diode are provided to permit symmetrical processing of both positive-going and negative-going deflection signals.

It is, therefore, a principal objective of the present invention to provide an electromagnetic deflection circuit capable of switching automatically between a linear mode of operation and a non-linear mode of operation solely in response to the rate of change of an input waveform.

It is an additional principal objective of the present invention to provide a deflection circuit capable of switching automatically from a linear mode to a non-linear mode whenever an input waveform changes at a rate greater than a predetermined design value.

It is a feature of the present invention to provide a deflection circuit capable of processing either positive-going or negative-going deflection signals.

The foregoing objectives, features, and advantages of the present invention will be more readily understood upon consideration of the following detailed description of the invention taken in conjunction with the accompanying drawings.

DETAILED DESCRIPTION OF THE PREFERRED EMBODIMENT

Figure 1:
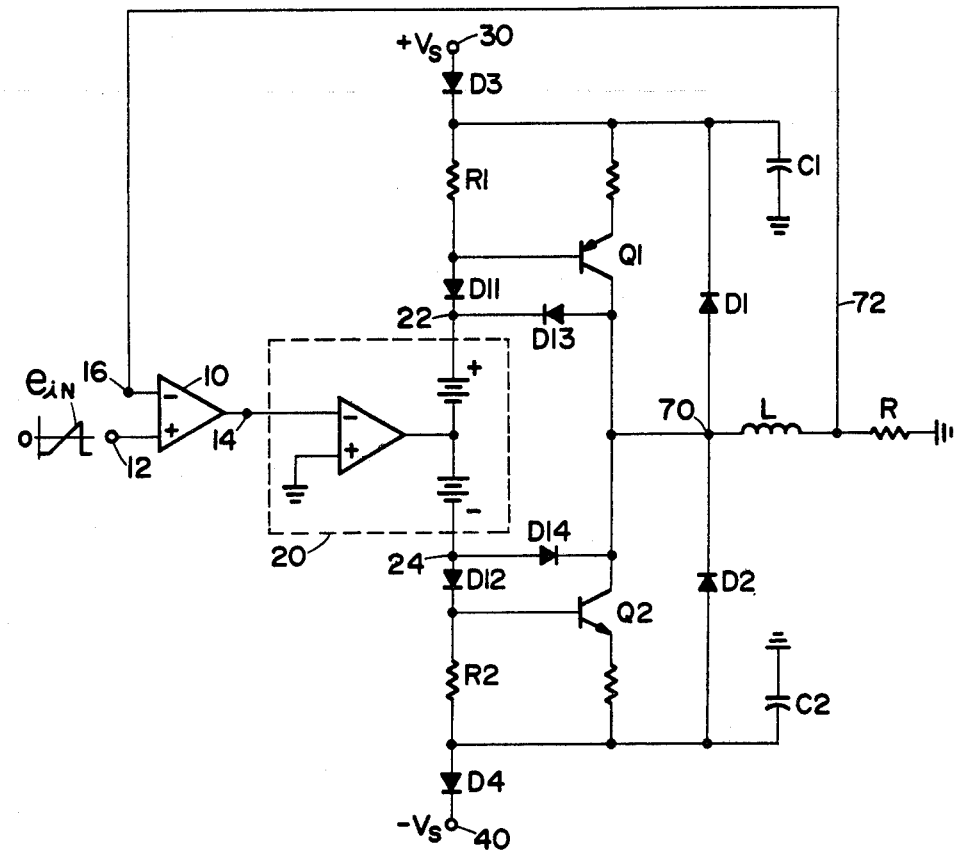
FIG. 1 is a simplified schematic representation of the circuit of the present invention.

Referring first to FIG. 1, there is shown in simplified schematic representation a circuit embodying the novel features of the present invention. As disclosed, the circuit includes in somewhat symmetrical arrangement a difference amplifier 10, a driver amplifier 20, two transistors Q1 and Q2, four diodes or other suitable unidirectional current conductive means D1, D2, D3, and D4, two fly-back capacitors C1 and C2, an inductor L representing the yoke inductance of a cathode-ray tube electromagnetic deflection system, and a resistor R, all interconnected as indicated between a source 30 of positive DC potential $+V_s$ and a source 40 of negative DC potential $-V_s$. The only signal input to the circuit is a conventional ramp voltage $e_{in}$ applied at terminal 12 of the difference amplifier 10. The object of the circuit is to provide a current through the inductance L that follows as closely as possible the waveform of the input voltage.

The difference amplifier 10 may be of any conventional design capable of providing a voltage at its output terminal 14 that is representative of the difference between the input signal $e_{in}$ and a second voltage applied at a second input terminal 16. Similarly, the driver amplifier 20 may be of any conventional design capable of providing at a first output terminal 22 a positive signal that varies inversely with changes in the difference signal, and at a second output terminal 24 a negative signal of similar variation. A symbolic representation of the latter amplifier 20 is shown within the dashed-line enclosure of FIG. 1. Suitable examples of both amplifiers are well known to the art and readily available in the marketplace. The two resistors R1, R2 are employed as indicated in the figure to ensure that the signals supplied to the transistors Q1, Q2 by the driver amplifier 20 remain unaffected, relative to the two transistors, by changes in the voltages applied to the transistor emitters due to, for example, changes in the charges developed within the two capacitors C1, C2. The four diodes D11, D12, D13, and D14 are included in the circuit, and employed in a conventional manner, to ensure that the two transistors Q1, Q2 do not become saturated during extreme excursions of their collector voltage.

Omitted from the circuit diagram of FIG. 1 for clarity are such conventional circuit elements as may be required to form a practical circuit. Such components, and their conventional placement within the circuit, are well understood by those persons skilled in the art and need not be discussed here in detail.

Figure 2:
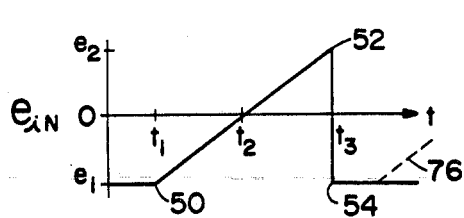
FIGS. 2 and 3 are diagrammatic representations of certain waveforms present within the circuit of FIG. 1 during its operation.
Figure 2:
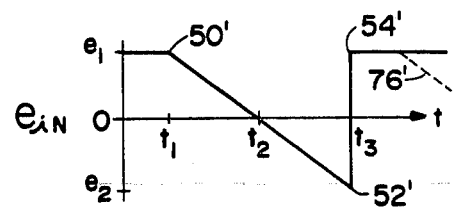
Figure 2:
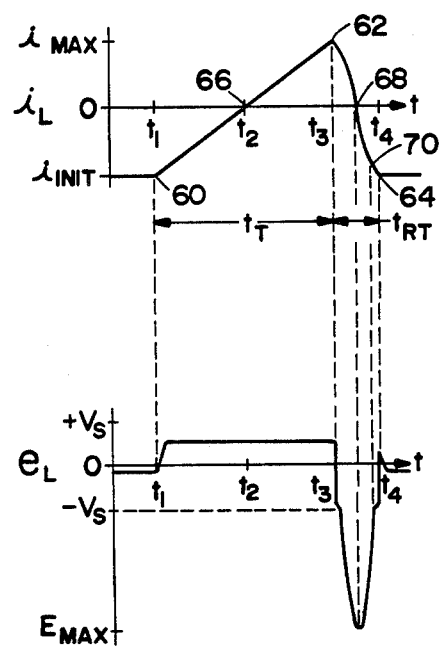
Figure 2:
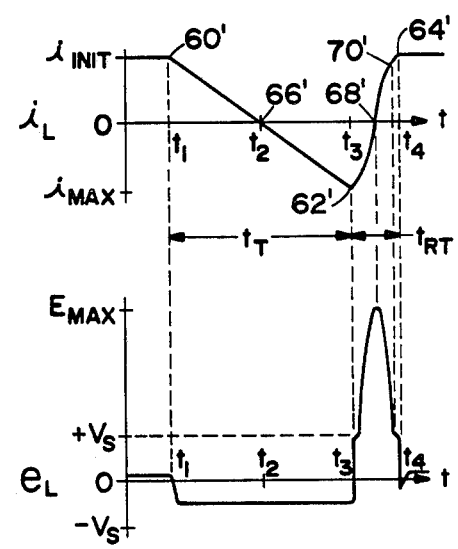
Figure 2:
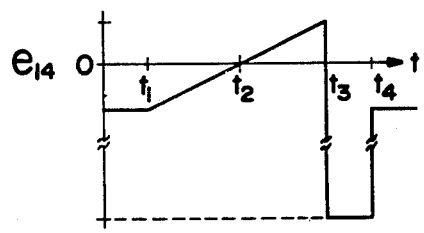

Referring now to the three waveforms disclosed in FIG. 2 of the drawings, the top waveform labeled $e_{in}$ is the input voltage signal applied to the input terminal 12 of the difference amplifier 10 and represents a conventional sawtooth input voltage employed in an electromagnetic deflection system to cause the horizontal deflection of an electron beam across the display screen of a cathode-ray tube. In a raster-scan display environment, a similar signal, except for magnitude and time duration, is employed to cause beam deflection in the vertical direction; however, for purpose of this disclosure, beam deflection may be assumed, without limitation, to be in the horizontal direction only. As shown in the figure, the signal $e_{in}$ rises linearly from an input negative value $e_1$ at time $t_1$ (point 50) to a maximum value $e_2$ at time $t_3$ (point 52) and then drops abruptly back to $e_1$ (point 54). The portion of the signal extending between point 50 and point 52 is defined as the forward scan portion, and the portion extending between point 52 and point 54 is defined as the reverse retrace portion. The magnitude of the initial voltage $e_1$ is equal to the magnitude of the maximum voltage $e_2$ and the center potential of both the forward scan portion and the reverse retrace portion is zero.

The second curve of FIG. 2 is a diagrammatic representation of the current $i_L$ flowing through the yoke L in response to the input voltage $e_{in}$. As disclosed, $i_L$ also rises in a substantially linear manner from an initial negative value $i_{init}$ at time $t_1$ (point 60) to a maximum positive value $i_{max}$ at time $t_3$ (point 62) and then drops in a substantially resonant sinusoidal manner back to the initial value $i_{init}$ at time $t_4$ (point 64). The time $t_3$ minus $t_1$ is defined as the trace time $t_T$, and the time $t_4$ minus $t_3$ is defined as the retrace time $t_{RT}$.

The third waveform of FIG. 2 is a representation of the voltage $e_L$ developed across the yoke L in response to the current $i_L$ flowing therethrough. The bottom waveform represents the difference signal $e_{14}$ developed at the output terminal 14 of the difference amplifier 10. The characteristics of these last two waveforms are best explained during a discussion of the circuit operation.

Referring now to both the circuit of FIG. 1 and the four waveforms of FIG. 2, the operation of the circuit will be described. Assume for purposes of discussion that the initial value of the input signal $e_{in}$ is $e_1$ and that of the current $i_L$ is $i_{init}$. Under these conditions, a negative potential $e_R$ proportional to the current $i_L$ is developed across the resistor R and transmitted via conductive path 72 back to the second input terminal 16 of the difference amplifier 10. (Note that, throughout the operation of the circuit, the potential $e_R$ developed across the resistor R will follow precisely the curve of the current $i_L$; hence, assuming an initial $e_R$ less than $e_1$, the difference curve $e_{14}$. In practice, extreme excursions of the difference signal are limited, as indicated by the dashed line of the $e_{14}$ waveform, by the dynamic range of the particular amplifier used.) The resulting negative difference signal $e_{14}$ produced at the output terminal 14 of the amplifier 10 causes, via the driving amplifier 20, transistor Q1 to be biased non-conductive and transistor Q2 to be biased conductive, thus producing at point 70 in the circuit the slightly negative voltage $e_L$ indicated in the third diagram of FIG. 2. Initial current flow through the circuit is therefore in the negative direction from ground, through resistor R, the yoke L, the transistor Q2 and diode D4, to the negative source 40. With transistor Q1 held non-conductive, the diode D2 is biased in the reverse direction, effectively isolating the capacitor C2 from the circuit.

At time $t_1$, the input voltage $e_{in}$ begins its linear rise, thereby creating an imbalance between it and the feedback voltage $e_R$. This imbalance, maintained by the continuing rise of the input voltage, produces a similar rise in the difference voltage $e_{14}$ at the output terminal 14 of the difference amplifier 10 which causes in turn the transistor Q2 to be biased progressively less conductive and the current $i_L$ flowing in the negative direction through the yoke L to be progressively decreased. At time $t_2$, the input voltage $e_{in}$ and the feedback voltage $e_R$ both pass through zero, causing the transistor Q2 to be biased non-conductive and the transistor Q1 to be biased conductive. As the input voltage $e_{in}$ increases positively from time $t_2$ to time $t_3$, the transistor Q1 is biased progressively more conductive, thereby increasing the current $i_L$ through the yoke L. At time $t_3$, the input voltage $e_{in}$ drops abruptly to its initial value $e_1$, pulling the difference voltage $e_{14}$ to a negative value limited by the dynamic range of the difference amplifier 10 as indicated earlier, and causing transistor Q1 to be biased non-conductive.

Note that during the time $t_3$ minus $t_1$, the current $i_L$ through the yoke L follows the input voltage $e_{in}$ in a linear manner and, since the input voltage itself changes linearly and the voltage $e_L$ across the yoke is defined by the known relationship $e_L = L di_L/dt$, $e_L$ is of constant positive magnitude. From time $t_1$ to time $t_2$, the voltage $e_L$ is maintained by the decreasing negative portion of the current $i_L$, and from time $t_2$ to time $t_3$, it is maintained by the increasing positive portion of the same current.

At the instant $t_3$ that the input signal $e_{in}$ drops, from point 52 to point 54 in FIG. 2, to its initial value $e_1$, the value of the current $i_L$ is $i_{max}$ and the energy stored in the yoke is $Li^2_{max}/2$. With the discontinuation of current flow through the transistor Q1, the voltage $e_L$ induced in the inductive yoke L reverses polarity and increases in magnitude to a level significantly greater than that of the negative source 40. This causes the diode D2 to become forward biased and the diode D4 to become reverse biased, thereby connecting the fly-back capacitor C2 into the circuit and permitting the energy stored in the yoke L to be transferred in a resonant sinusoidal manner from the yoke to the capacitor. This phenomenon is illustrated by waveforms $i_L$ and $e_L$ of FIG. 2 wherein the current through the yoke L is seen to decrease in a sinusoidal manner from point 62 until reaching a zero value at point 68, and the voltage across the yoke is seen to reverse abruptly from the previous positive value to a substantially greater negative value. At point 68 of the $i_L$ waveform, the energy stored in the yoke L has been transferred completely to the capacitor C2, the diode D2 is again reverse biased, and the capacitor begins to discharge in the opposite direction through the resistor R, the yoke L, and the now forward biased transistor Q2 until the voltage induced in the yoke reaches a level causing the diode D4 to once again become forward-biased and return the circuit to a linear operation, as illustrated in the $i_L$ waveform between point 70 and point 64. As is known to the art, the time required for the current $i_L$ to drop from the value $i_{max}$ to the value $i_{init}$ is approximately $\pi\sqrt{LC}$. Normally, in a repetitive-sweep environment and at a predetermined time dependent upon the sweep rate, the input voltage signal $e_{in}$ will restart its linear increase as indicated by the dotted line 76 of FIG. 2 and the above-described operation will be repeated.

It should be noted that, if the input voltage $e_{in}$ changes at a rate sufficiently slow during retrace time, the current $i_L$ will follow in a linear manner. As indicated earlier, the point at which the capacitor C2 is coupled into the circuit is the point at which the diode D2 becomes forward biased, and that occurs when the voltage $e_L$ induced in the yoke L becomes more negative than approximately $-V_s$, the negative potential of the source 40. As the voltage $e_L$ is defined by $L di_L/dt$, and $i_L$ is directly proportional to $e_{in}$, any change in the slope of the input voltage waveform will cause a proportional change in the level of the induced voltage. If the retrace rate is sufficiently slow, the voltage $e_L$, although negative, will be less negative than that of the source 40. When the induced voltage becomes more negative than the approximately $-V_s$ potential of the source 40, that is, when the retrace rate exceeds a predetermined design value, the diode D2 becomes forward biased and the circuit assumes the non-linear operation described earlier. During the decreasing-positive-current phase of such non-linear operation, the current through the diode D2 charges the capacitor C2 to a negative voltage also greater than that of the source 40. During the increasing-negative-current phase, the discharging capacitor C2 causes a faster rate of change in the yoke current $i_L$ than would be possible via the source 40 alone. When the capacitor C2 has discharged sufficiently, the voltage $e_L$ will approach that of the source 40 and the circuit will revert to the linear operation discussed earlier.

Thus, it is seen that the unique configuration in the circuit of FIG. 1 of the diode D2 and the capacitor C2 permits the circuit to be switched automatically from a linear mode of operation during the forward scan portion of an input deflection waveform to a non-linear resonant mode of operation during a reverse retrace portion of such waveform. As disclosed, this is accomplished solely in response to changes in the input waveform, and does not require the generation or synchronization of any additional timing signals.

Figure 3:
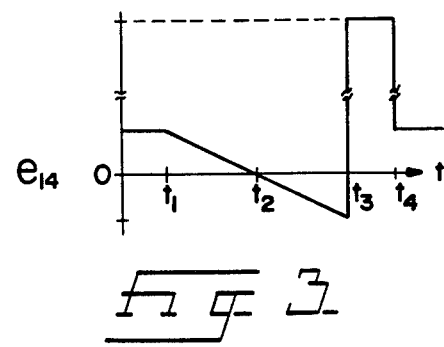

An inherent advantage of the circuit of the present invention is that, with the inclusion of a second diode D1 and a second fly-back capacitor C1, it is capable of symmetrical operation; that is, it will switch automatically between its linear mode and its non-linear mode irrespective of whether the input waveform $e_{in}$ is increasing from a negative value to a positive value or decreasing from a positive value to a negative value. The latter case is illustrated in the four waveforms of FIG. 3 wherein pertinent points of each waveform have been labeled with the same numbers, only primed, as appear in the corresponding waveforms of FIG. 2. The operation of the circuit of FIG. 1 according to the waveforms of FIG. 3 will be apparent to those persons skilled in the art without further elaboration.

Although the circuit of the present invention has been described above with regard to an electromagnetic deflection system, it is understood that the scope of the invention is not so limited. In particular, there is no requirement that the inductance L be a deflection yoke, and the circuit may therefore be employed in the manner disclosed to produce a controlled current through any inductance.

The terms and expressions which have been used in the foregoing specification are used therein as terms of description and not of limitation, and there is no intention in the use of such expressions, of excluding equivalents of the features shown and described or portions thereof, it being recognized that the scope of the invention is defined and limited only by the claims which follow.

We claim as our invention:

1. A circuit for controlling current flow through an inductance comprising:
    (a) an inductance;
    (b) means for receiving a variable input signal;
    (c) amplifier means for producing in said inductance a controlled current representative of said input signal, said amplifier means being capable of operation in either a linear mode or a non-linear mode; and
    (d) means responsive solely to the rate of change of said variable input signal for coupling a capacitance in parallel resonant connection with said inductance whenever said input signal changes at a rate greater than a predetermined design rate, thereby causing said amplifier means to switch from said linear mode to said non-linear mode.

2. The current controlling circuit of claim 1 wherein said means (d) includes a unidirectional current conductive means for selectively coupling said capacitance into parallel resonant connection with said inductance.

3. The current controlling circuit of claim 2 wherein said amplifier means (c) includes a source of DC potential, and wherein said means (d) includes means for activating said conductive means so as to connect said capacitance with said inductance whenever a potential developed across said inductance is greater than that of said source.

4. The current controlling circuit of claim 2 wherein said amplifier means (c) further includes means for deactivating said conductive means so as to disconnect said capacitance from said inductance whenever said inductance potential is less than that of said source.

5. The current controlling circuit of claim 1 wherein said inductance comprises the deflection yoke of a cathode-ray tube electromagnetic deflection system.

6. The current controlling circuit of claim 3 wherein said DC potential of said source is of a negative sense and wherein said conductive means operates to connect said capacitance with said inductance whenever said inductance potential is more negative than said source potential.

7. The current controlling means of claim 6 wherein said amplifier means (c) further includes a second source of positive DC potential, and wherein said means (d) includes a second capacitance and second unidirectional current conductive means for coupling said second capacitance into parallel resonant connection with said inductance whenever said inductance potential is more positive than said second source potential.

8. The current controlling circuit of claim 2 wherein said inductance potential is a function of the rate of change of said input signal.

* * * * *